United States Patent [19]

Bryant et al.

[11] Patent Number: 5,742,095
[45] Date of Patent: Apr. 21, 1998

[54] METHOD OF FABRICATING PLANAR REGIONS IN AN INTEGRATED CIRCUIT

[75] Inventors: Frank Randolph Bryant, Denton; Robert Louis Hodges, Euless, both of Tex.

[73] Assignee: SGS-Thomson Microelectronics, Inc., Carrollton, Tex.

[21] Appl. No.: 752,749

[22] Filed: Nov. 20, 1996

Related U.S. Application Data

[60] Continuation of Ser. No. 434,472, Apr. 1, 1996, abandoned, which is a division of Ser. No. 172,636, Dec. 22, 1993, Pat. No. 5,543,343.

[51] Int. Cl.$^6$ ................................................. H01L 23/58
[52] U.S. Cl. .......................... 257/647; 257/510; 257/640; 257/752; 257/305; 257/396
[58] Field of Search ............................... 257/510, 519, 257/640, 750, 752, 755, 305, 395, 396, 647

[56] References Cited

U.S. PATENT DOCUMENTS

| | | | |
|---|---|---|---|
| 4,026,740 | 5/1977 | Owen, III | 156/628 |
| 4,160,987 | 7/1979 | Dennard et al. | 357/41 |
| 4,266,985 | 5/1981 | Ito et al. | 148/1.5 |
| 4,407,696 | 10/1983 | Han et al. | 156/653 |

(List continued on next page.)

FOREIGN PATENT DOCUMENTS

| | | | |
|---|---|---|---|
| 58-90778 | 5/1983 | Japan | H01L 29/62 |
| 63-289820 | 11/1988 | Japan | H01L 21/306 |
| 1-14926 | 1/1989 | Japan | H01L 21/318 |
| 1-205553 | 8/1989 | Japan | H01L 21/94 |

OTHER PUBLICATIONS

S. Marshall, et al., "Dry Pressure Local Oxidation of Silicon for IC Isolation", J. Electrochem Society, V. 122, No. 10, Oct. 1975, pp. 2411–2412.

Zeto, et al., "Low Temperature Thermal Oxidation of Silicon by Dry Oxygen Pressure above 1 Atm", J. Electrochemical Society v. 122, No. 10, Oct. 1975, pp. 1409–1410.

Lin, et al., "Twi–White–Ribbon Effect and Pit Formation Mechanism in PLBOCOS", J. Electrochem Soc., V. 138, No. 7, Jul. 1991, pp. 2145–2149.

"An Integrated Isolation/Gate Process for Sub–Quarter Micron Technologies", AT&T, 1993 Symposium on VLSIU Technology, pp. 141–142 no month.

"VIB–1 Integration of Poly Buffered LOCOS and Gate . . . ", AT&T, IEEE Transactions on Electron Devices, V. 38, No. 12, Dec. 1991, p. 2721.

"Residual Stress, Chemical Etch Rate, Refractive Index . . . ", Irene, et al., J. Electrochem Soc., Feb. 1980, pp. 396–399.

*Primary Examiner*—Tom Thomas
*Assistant Examiner*—David B. Hardy
*Attorney, Agent, or Firm*—Theodore E. Galanthay; Kenneth C. Hill; Lisa K. Jorgenson

[57] ABSTRACT

A method is provided for forming a planar surface of a semiconductor integrated circuit, and an integrated circuit formed according to the same. A gate oxide layer is formed over a silicon substrate. A first polysilicon layer is formed over the gate oxide layer and a nitride layer is formed over the first polysilicon layer. The first polysilicon and nitride layers are then patterned and etched to form an opening which exposes a portion of the gate oxide layer. An oxidation step is then performed to form a field oxide region in the opening. The field oxide region is formed to a thickness having an upper surface substantially planar with an upper surface of the first polysilicon layer. The nitride layer is then removed and the gate oxide and first polysilicon layers are patterned and etched to form a gate electrode and an interconnect. A silicide or other conductive layer, such as a second polysilicon layer, may be formed over the remaining first polysilicon regions and a portion of the field oxide layer to connect the gate and interconnect since the upper surface of the first polysilicon layer is substantially planar with the upper surface of the field oxide region and does not cross over the field oxide region.

8 Claims, 4 Drawing Sheets

U.S. PATENT DOCUMENTS

| | | | |
|---|---|---|---|
| 4,508,757 | 4/1985 | Fabricius et al. | 427/93 |
| 4,551,910 | 11/1985 | Patterson | 29/576 |
| 4,553,314 | 11/1985 | Chan et al. | 29/571 |
| 4,868,136 | 9/1989 | Ravaglia | 257/640 |
| 5,151,381 | 9/1992 | Liu et al. | 437/69 |
| 5,160,986 | 11/1992 | Bellezza | 257/396 |
| 5,192,707 | 3/1993 | Hodges et al. | 437/69 |
| 5,198,683 | 3/1993 | Sivan | 257/395 |
| 5,210,056 | 5/1993 | Pong et al. | 437/239 |
| 5,241,198 | 8/1993 | Okada et al. | 257/236 |
| 5,258,333 | 11/1993 | Shappir et al. | 437/235 |
| 5,260,229 | 11/1993 | Hodges et al. | 437/69 |
| 5,264,724 | 11/1993 | Brown et al. | 257/347 |
| 5,296,411 | 3/1994 | Gardner et al. | 437/238 |
| 5,310,692 | 5/1994 | Chan et al. | 437/41 |

METHOD OF FABRICATING PLANAR REGIONS IN AN INTEGRATED CIRCUIT

This is a continuation of application Ser. No. 08/434,472, filed Apr. 1, 1996, now abandoned, which is a division of application Ser. No. 08/172,636 filed Dec. 22, 1993, now U.S. Pat. No. 5,543,343.

FIELD OF THE INVENTION

The present invention relates generally to semiconductor integrated circuit processing, and more specifically to an improved method of forming isolation structures which are substantially coplanar with devices formed in adjacent active regions.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the very-large-scale integration (VLSI) levels, more and more layers are added to the surface of the wafer. These additional layers in turn create more steps on the wafer surface. The resolution of small image sizes in photolithography thus becomes more difficult over the additional steps due to light reflection and the thinning of the photoresists over the steps. Planarization techniques become increasingly more important to offset the effects of a varied topography.

In addition to the geometries and sizes of active components, the chip area also depends on the isolation technology used. Sufficient electrical isolation must be provided between active circuit elements so that leakage current does not cause functional or specification failures. Increasingly more stringent specifications, together with the demand, for example, for smaller memory cells in denser memory arrays, places significant pressure on the isolation technology in memory devices, as well as in other modern integrated circuits.

A well-known and widely-used isolation technique is the local oxidation of silicon, commonly referred to as LOCOS. The LOCOS process was a great technological improvement in reducing the area needed for the isolation regions and decreasing some parasitic capacitances. Thermal silicon dioxide is formed is areas not covered by an oxidation barrier such as areas where active devices are to be formed. The oxidation barrier is generally silicon nitride over a pad or gate oxide. The wafer is typically placed in a wet oxidizing environment, generally in steam at a high temperature such as 1000° C. The portions of the wafer not covered by the oxidation barrier are oxidized. This LOCOS field oxide is generally formed to a sufficient thickness that a conductor placed over the field oxide will not invert the channel underneath, when biased to the maximum circuit voltage.

While LOCOS isolation is widely-used in the industry, it is subject to certain well-known limitations. A first significant limitation of LOCOS is lateral encroachment of the oxide into the active regions, known as "birdbeaking", due to oxidation of silicon under the edges of the nitride or barrier mask. The expected distance of such encroachment must be considered in the layout of the integrated circuit because the active area becomes smaller than the initial dimensions of the nitride layer. The encroachment may by reduced by reducing the field oxide thickness, but at a cost of reduction of the threshold voltage of the parasitic field oxide transistor, and thus reduction of the isolation provided.

Attempts to suppress birdbeaking in LOCOS, such as forming thicker nitride barrier layers, cause stress-related defects in the nearby substrate due to the difference in the thermal coefficients of expansion between the silicon substrate and the silicon nitride layers. Process complexity also increases substantially in attempting to avoid these stress-related defects. To achieve submicron geometries, there can be little or no physical loss of the active areas as occurs with the birdbeaking phenomenon.

To reduce the bird's beak effect, there has been proposed the use of a polysilicon layer between the nitride layer and the pad oxide layer as more fully described in U.S. Pat. No. 4,407,696, issued Oct. 4, 1983 to Han et al. The use of the polysilicon layer in the LOCOS process, known as poly-buffered LOCOS or PBLOCOS, is used to reduce oxidation induced stacking faults resulting from the stress caused by the different thermal coefficients of expansion between the silicon substrate and a thick silicon nitride layer overlying the substrate. As described more fully in the publication "Twin-White-Ribbon Effect and Pit Formation Mechanism in PBLOCOS", J. Electrochem. Soc., Vol. 138, No. 7, July 1991 by Tin-hwang Lin et al, the polysilicon layer absorbs the excessive stress caused by the silicon nitride and prevents the lateral encroachment of oxidants, thus reducing the bird's beak.

In addition to the lateral encroachment limitation of LOCOS, the isolation technique of LOCOS adds topography to the integrated circuit surface. The additional topography is a result of the silicon dioxide necessarily occupying a greater volume than that of the silicon prior to its oxidation, due to the reaction of the silicon to oxygen. As a result, the surface of conventional LOCOS field oxide is above the surface of the active regions, with approximately half of the oxide thickness being above the active region surface. This topography requires overlying conductors to cover steps at the edges of the field oxide which presents the potential for problems in patterning and etching the conductor layer and in the reliability of the conductor layer. In addition, the depth of focus required for submicron photolithography can be effectively reduced by the topography of the wafer surface.

In addition to the above described limitations, with the LOCOS or PBLOCOS techniques, an undesired nitride spot forms along the interface of the silicon substrate and silicon oxide regions. These nitride spots are the result of the well-known "Kooi" effect which refers to the formation of a thin layer of silicon nitride along the surface of the silicon substrate as more fully described in U.S. Pat. No. 5,258,333, issued on Nov. 2, 1993 to Shappir et al. This silicon nitride is formed from the reaction of $H_2O$ and the nitride layer used as the oxidation barrier over the active areas during the step of thermally growing the field oxide. This reaction forms NH₃ which diffuses through the pad or gate oxide to react with the surface of the silicon substrate to form the nitride spots or "white ribbon". These nitride spots or white ribbons limit the growth of subsequently formed oxide layers at these nitride locations. The white ribbons can thus cause poor reliability and substandard performance of devices such as gate electrodes which have gate oxide layers in these locations.

Various PBLOCOS techniques may be used to reduce the oxidation induced stacking faults in conjunction with methods of removing the nitride spots. One such method is described more fully in U.S. patent application Ser. No. 07/809,401 filed on Dec. 18, 1991 to Che-Chia Wei et al. Referring to FIG. 1, a portion of a wafer in which an integrated circuit is to be formed according to the prior art, is illustrated having a substrate 10. An oxide layer 12 is thermally grown over the surface of the substrate 10. A polysilicon layer 14 is formed over the oxide layer 12 and a nitride layer 16 is then formed over the polysilicon layer 14. Photoresist 18 is formed over the nitride layer 16 and patterned and etched to expose a portion of the nitride layer 16 in opening 20 as shown in FIG. 2. Layers 14 and 16 are removed to expose a portion of the oxide layer 12 in opening 22. Referring to FIG. 3, photoresist layer 18 is then removed and an oxidation step is performed, resulting in a field oxide region 24 formed above and below the substrate surface. Layers 12, 14 and 16 which were formed as a barrier over the active areas during the oxidation step are then removed.

Referring to FIG. 4, thin nitride spots 26 are formed along the interface between the oxide and the silicon substrate during the thermal oxidation step in which the field oxide region was formed. These nitride spots may negatively impact device performance of subsequently formed devices in this area and may be removed before any subsequent steps are carried out. There are various methods of removing these nitride spots before devices, such as field effect transistors, are formed, such that the integrity of the devices is maintained. As background information, one such method is described in U.S. Pat. No. 4,553,314 issued on Nov. 19, 1985 to Chan et al. A sacrificial oxide layer 28 is formed over the exposed silicon substrate. As can be seen in FIG. 4, the sacrificial oxide layer 28 is thinned over the area of the nitride spots. However, as layer 28 consumes part of the silicon substrate during formation, it also oxidizes the nitride residue from the substrate. Thus, when layer 28 is removed, the nitride residue is also removed.

After the sacrificial oxide layer is removed, the surface of the silicon substrate is then ready for devices to be formed in the active areas adjacent to the field oxide. Referring to FIG. 5, once the nitride spots are removed, a gate oxide layer 30 and polysilicon layer 32 are formed over the surface of the silicon substrate and the field oxide region 24. This gate oxide/polysilicon stack can then be patterned and etched to form a gate electrode 34 and interconnect 36 as shown in FIG. 6.

The additional steps of forming and removing the sacrificial oxide layer 28 to remove the undesired nitride spots, however, add complexity and thus additional manufacturing costs. The increase in processing steps may lower the yield and lower the reliability due to a higher probability of creating defects. An additional step is also created between the field oxide and substrate which increases the topography over the wafer. This additional topography causes additional step coverage problems at later stages and may present problems in etching the polysilicon gate and the interconnect where it crosses over the field oxide.

It is therefore an object of the present invention to provide a method of forming isolation regions or structures and devices in active areas adjacent to the isolation regions having substantially coplanar upper surfaces to minimize subsequent step coverage problems.

It is a further object of the present invention to provide such a method of forming the active devices adjacent to the isolation regions or structures with significantly fewer processing steps which will decrease the manufacturing complexity and produce higher yields and reliability.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. An oxide layer is formed over the silicon substrate. A polysilicon layer is formed over the oxide layer and a nitride layer is formed over the polysilicon layer. The polysilicon/nitride stack is patterned and etched to form an opening exposing an area of the oxide layer. An oxidation step is performed to form a field oxide region in the opening. The field oxide region is formed to a thickness having an upper surface substantially planar with an upper surface of the polysilicon layer. The nitride layer is then removed. The oxide and polysilicon layers are then patterned and etched to form a gate electrode and an interconnect whereby the upper surface of the polysilicon region and the field oxide region remain substantially coplanar.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Figure 1:
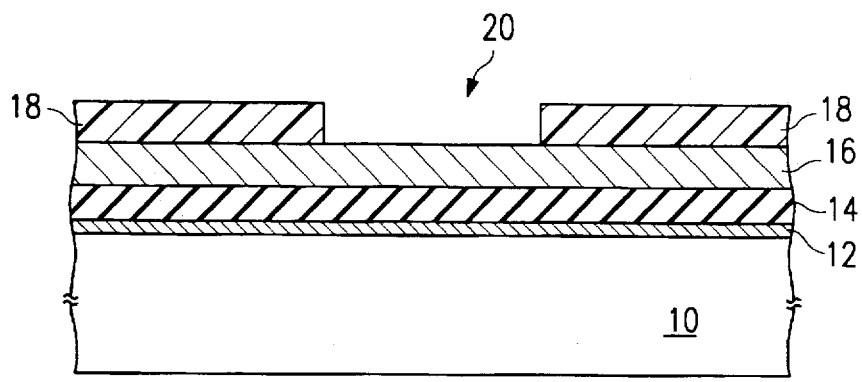
FIGS. 1–6 are cross sectional views of the fabrication of a semiconductor integrated circuit according to the prior art.
Figure 2:
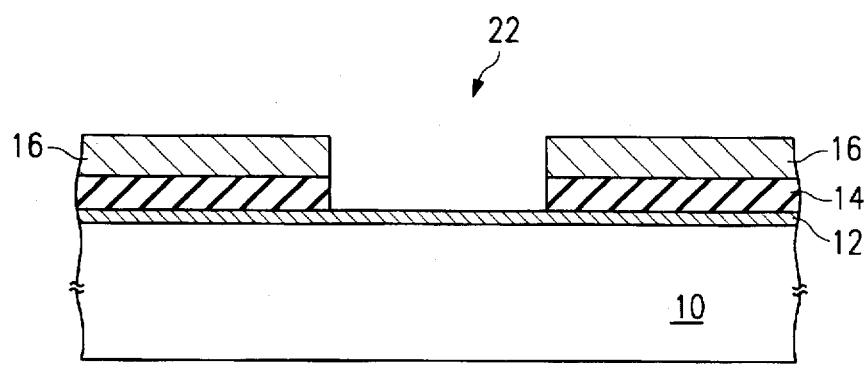
Figure 3:
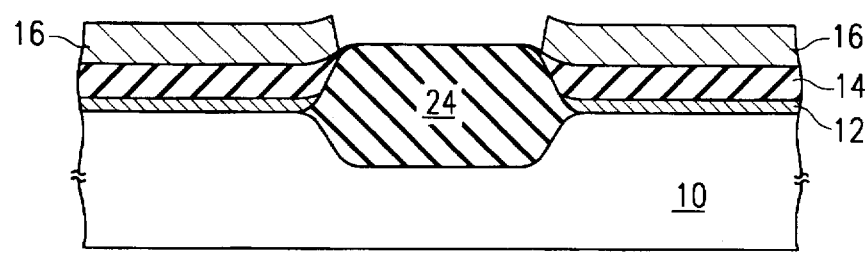
Figure 4:
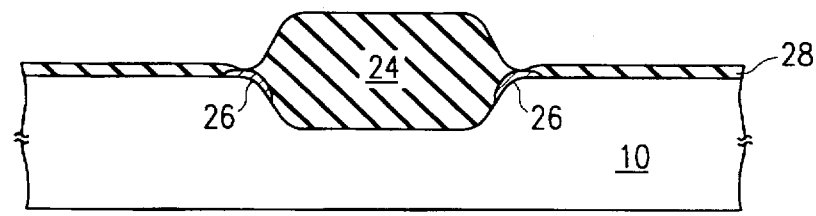
Figure 5:
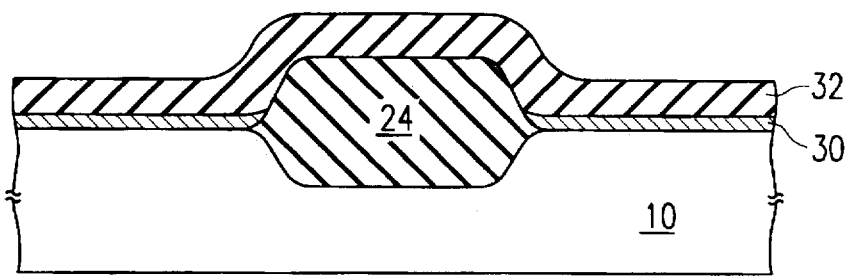
Figure 6:
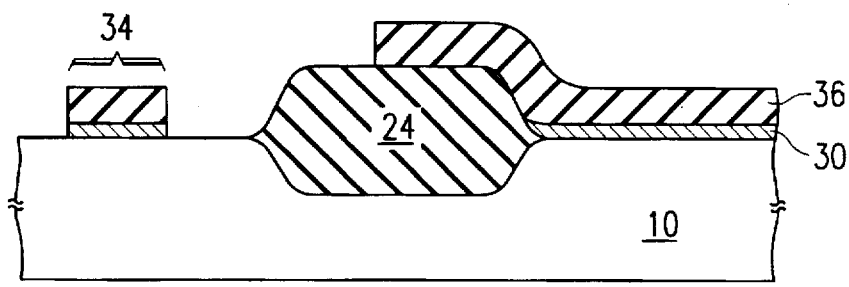

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring now to FIGS. 7–11, a preferred embodiment of the present invention will now be described in detail. FIG. 7A illustrates a portion of a wafer, in cross-section, which has a surface at which isolation structures and devices in adjacent active areas are to be formed. As shown in FIG. 7A, an integrated circuit is to be formed on a silicon substrate 40. The silicon substrate may be p- or n-doped silicon depending upon the location in the wafer where the isolation and active devices are to be formed. An oxide layer 42 is thermally grown over the silicon substrate 40 to a depth of approximately 20 to 300 angstroms. A buffer polysilicon layer 44 is deposited over the oxide layer 42 to a depth of approximately 100 to 2000 angstroms. As described above in the PBLOCOS techniques, polysilicon layer 44 will help to reduce oxidation induced stacking faults resulting from stress caused between the silicon substrate and any overlying nitride layer during subsequent formation of isolation structures.

The gate oxide layer 42 may also be an oxide/nitride composite by forming a thin layer of nitride over the oxide. The thin nitride portion of the composite layer may be formed to a depth of approximately 10 to 200 angstroms typically by chemical vapor deposition or by rapid thermal nitridation of the oxide. Layer 42 may also be an oxide/nitride/oxide (ONO) composite formed by oxidizing the surface of the thin nitride. The oxidized portion of the ONO stack, or seal oxide, will typically have a thickness of approximately 10 to 30 angstroms. A thin nitride over oxide will serve to prevent the diffusion of the oxidizing ambient and ammonia into the polysilicon during the subsequent formation of a field oxide region and will form a high integrity oxide/nitride gate dielectric as more fully described in U.S. Pat. No. 5,260,229 issued on Nov. 9, 1993 to Hodges et al. A seal oxide, if formed over the nitride, will increase the capacitance and reliability of the total oxide\nitride\oxide composite dielectric layer 42.

A nitride layer 46 is then deposited, typically by chemical vapor deposition, to a depth of approximately 800 to 3000 angstroms over the polysilicon layer 44. The polysilicon layer 44 and nitride layer 46 are patterned and etched by way of conventional photolithography to form an opening 48 exposing a portion of the oxide layer 42. Alternatively, the oxide layer 42 may also be etched away exposing a portion of the silicon substrate 40. Layers 44 and 46 are removed from areas at which isolation structures are to be formed, thus acting as an oxidation barrier to protect active areas 51 in which devices will be subsequently formed.

Figure 7A:
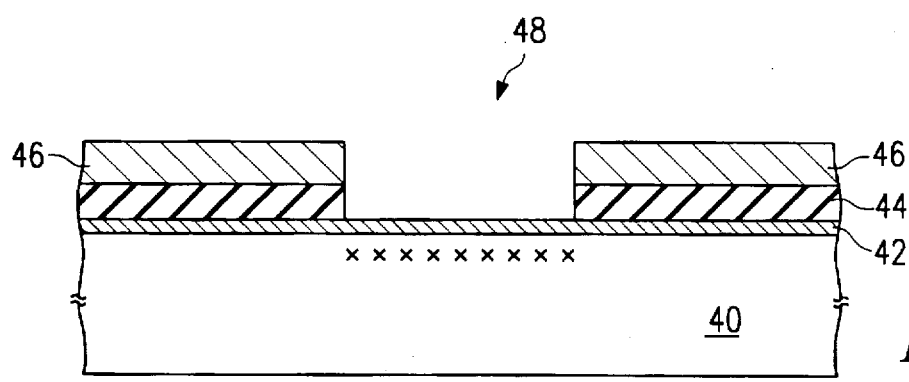
FIGS. 7–11 are cross sectional views of the fabrication of a semiconductor integrated circuit according to the present invention.
Figure 7B:
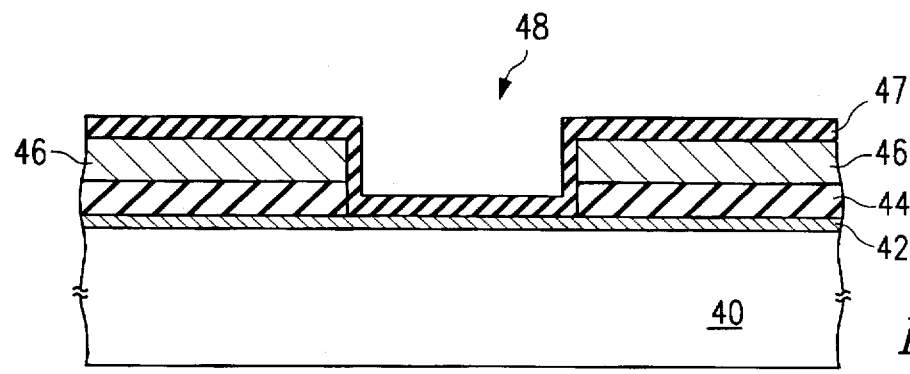
Figure 7C:
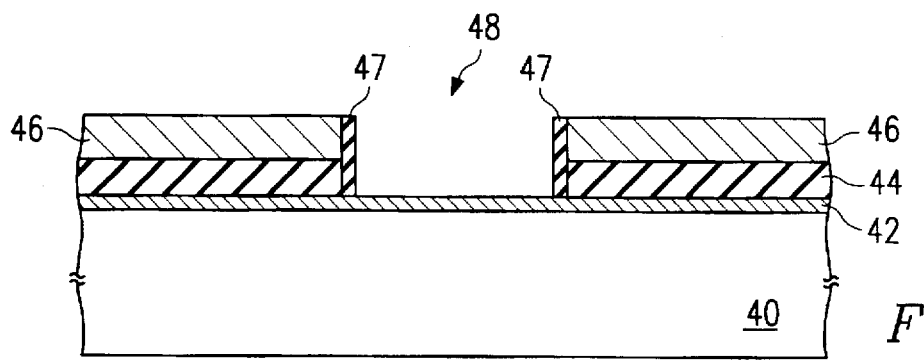
Figure 7D:
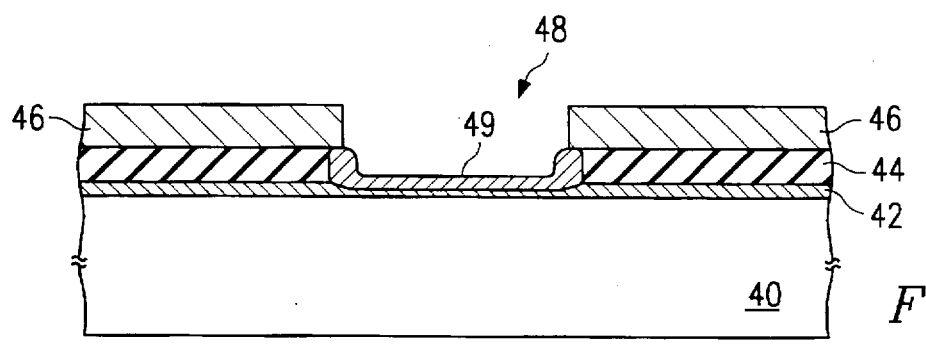
Figure 7E:
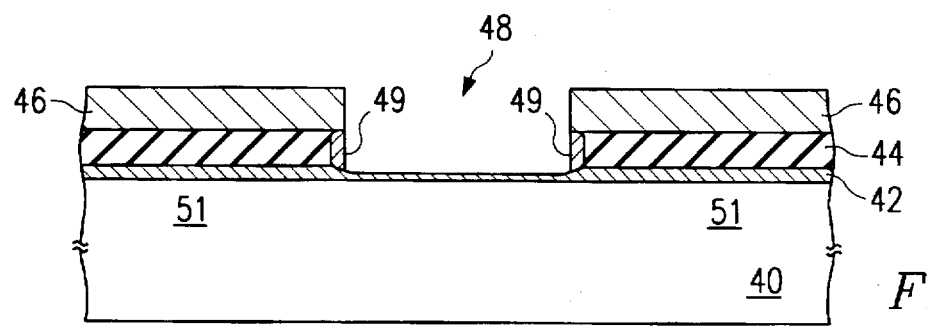

FIGS. 7B-7E illustrate an additional process, if desired, to encapsulate the polysilicon layer 44 to further protect the polysilicon layer 44 from oxidizing. Referring to FIG. 7B, a nitride sidewall 47 may be formed by chemical vapor deposition over nitride layer 46 and in the opening 48. The nitride formed in the bottom of the opening 48 over the oxide layer 42, or silicon substrate 40 if the oxide layer 42 has been etched away, is removed before any isolation structures are formed in the opening. An anisotropic etch may be used to remove the nitride in the opening as shown in FIG. 7C. Alternatively, a rapid thermal annealing (RTA) process may be used to nitridize the end of the polysilicon layer 44. Referring to FIG. 7D, The RTA process will nitridize the end of the polysilicon in opening 48 and a portion of the oxide layer 42 forming a nitride region 49. The RTA process will nitridize a portion of the silicon substrate if the oxide layer 42 was previously removed. As above, the nitride in the bottom of the opening must be removed before any isolation structures are formed. An anisotropic etch may also be used in this alternative to remove the nitride in the opening while protecting the polysilicon layer from oxidizing as shown in FIG. 7E. Nitride encapsulation of the polysilicon layer including the nitride sidewall 47 or nitride region 49 are more fully described in U.S. Pat. No. 5,260,229.

The opening 48 or location where the isolation structure is to be formed may be within a single doped region, such as an n- or p-well or may also be at boundaries between doped regions of opposite conductivity type, such as between n- and p-wells. Prior to oxidation of the silicon substrate in opening 48, a dopant may be implanted into the substrate in opening 48. This dopant, typically boron for n-channel devices, will form a channel stop implant as designated by the Xs in FIG. 7A.

Figure 8:
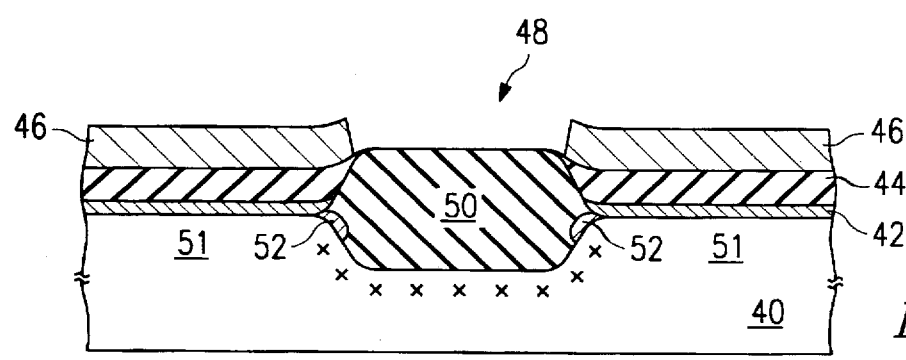

Referring to FIG. 8, an oxidation step is performed to thermally grow a field oxide region 50. The field oxide region will electrically isolate transistors in the same well or transistors in adjacent wells (generally represented as region 51). The oxidation is typically performed in steam for about 2 to 8 hours at approximately 900°-1100° C. Approximately half of the field oxide 50 penetrates into the substrate 40 and half will form above the surface of the substrate. The thickness or depth of the field oxide region 50 will depend upon the height of the polysilicon layer 44 above the surface of the silicon substrate 40. In other words, the field oxide region 50 should be formed whereby its upper surface is substantially planar with an upper surface of the polysilicon layer 44. The field oxide region 50 will have a thickness of approximately 2000 to 7000 angstroms. During the oxidation process, the channel stop implant will be driven further into the substrate underlying the field oxide region. Nitride spots 52 are formed during the oxidation process along the interface between the silicon substrate 40 and silicon oxide regions in which a silicon oxide layer 42 underlies the nitride mask or layer 46 during the oxidation process of forming the field oxide region 50.

Figure 9:
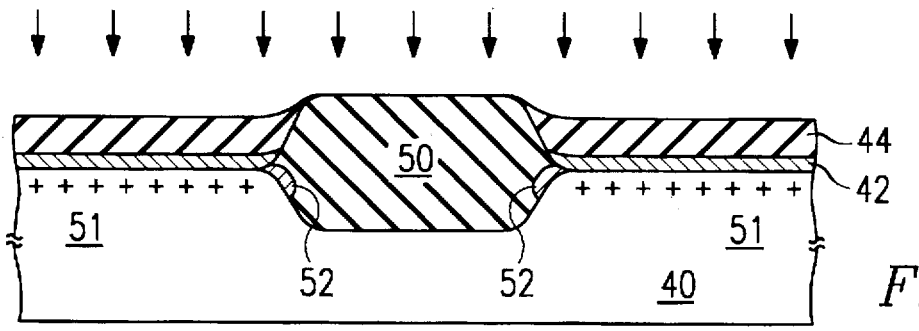

Referring to FIG. 9, the nitride layer 46, and any remaining nitride regions 47 or 49 if formed, are etched away leaving the upper surface of the polysilicon layer 44 substantially planar with the upper surface of the field oxide region 50. The topography of the wafer is now substantially planar for subsequent processing steps to begin. A blanket n-type dopant, typically phosphorous, as shown by the arrows is implanted or diffused into the polysilicon layer 44 to increase the conductivity of the polysilicon layer. At this stage, various implants may be performed as shown by the Xts, depending upon the location on the wafer, to adjust the threshold voltages of transistors to be formed in the active areas 51 on either side of the field oxide region 50. For example, a light dose of boron may be implanted through the polysilicon layer 44 and oxide layer 42 into the substrate 40 to adjust the threshold voltages of transistors in n-and/or p-wells on either side of the field oxide region 50. Additional boron implants may also be performed, as needed, in specific locations on the wafer to further adjust threshold voltages of the transistors.

Figure 10:
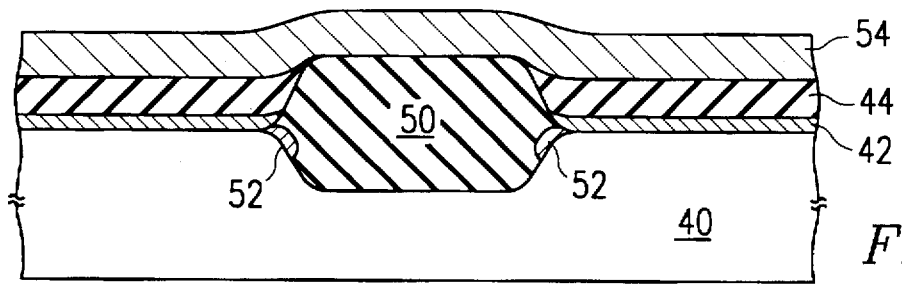

In the preferred embodiment, gate oxide layer 42 and polysilicon layer 44 will be retained and etched to form the gate electrode and interconnect. Referring to FIG. 10, because the polysilicon layer 44 is substantially planar with the field oxide region 50, the polysilicon layer 44 does not cross over the field oxide region 50. Where an interconnect is required to cross over field oxide regions, a low resistance layer 54 may be formed over the polysilicon layer 44 and field oxide region 50. The low resistance layer may be a silicide layer formed from a refractory metal such as titanium, tantalum, cobalt or nickel or deposited as a refractory metal silicide. Layers 42 and 44, and 54 if formed, are now ready to be patterned and etched by conventional methods to form the required devices over the active areas adjacent to the field oxide region 50. The low resistance layer 54 may also be a polysilicon layer which may be formed before the blanket dopant is implanted or diffused into the polysilicon layer 44. The low resistance polysilicon layer 54 may also be a composite layer having a salicide layer formed thereover by conventional methods.

Figure 11:
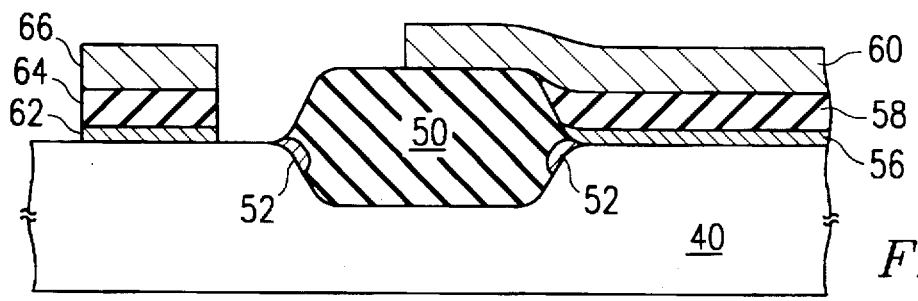

Referring to FIG. 11, layers 42, 44 and 54, if formed, are patterned and etched to form a gate electrode and an interconnect. Oxide region 56 and polysilicon region 58, along with the low resistance layer 60, if formed, will form the interconnect (which will also serve as a gate electrode outside the plane of the drawing). Low resistance layer 60 will extend the interconnect over the field oxide region. Oxide region 62 and polysilicon region 64, along with the low resistance layer 66, if formed, will be patterned and etched at the same time to form the gate electrode. Subsequent processing steps may now take place to form additional structures as is known in the art such as oxide sidewall spacers and source and drain regions (not shown). The nitride spots 52 may still exist along the surface of the substrate 40 at the interface with the silicon oxide. However, in the present invention, the original oxide layer 42 and polysilicon layer 44 have not been etched away as in the prior art, but instead have been retained to form the gate electrode and interconnect. Since the nitride spots were formed after the original gate oxide was formed, the original gate oxide layer did not thin out over this region. Thus, the sacrificial oxide layer to remove the nitride spots is not necessary since the nitride spots will not cause deleterious effects to the integrity of the transistors built having gate oxides in this region. One disadvantage of the present invention is that the bird's beak formed during the oxidation process in steam to grow the field oxide region will be longer than if the sacrificial oxide layer were formed and removed. An alternative to reducing the bird's beak in the present invention is to form the field oxide region in dry oxygen, preferably at greater than atmospheric pressure, as more fully described in the article titled "Dry Pressure Local Oxidation of Silicon for IC Isolation", printed in Vol. 122, No. 10, 1975 in the Journal of the Electrochemical Society, to S. Marshall et al. In addition to reducing the bird's beak, using dry $O_2$ may reduce the amount of nitride spots formed.

The present invention substantially reduces the number of processing steps needed to form a high integrity gate electrode and interconnect by eliminating the pad oxide and polysilicon layers and the sacrificial oxide layer needed to remove the nitride spots. Decreasing the number of processing steps increases device yield and reliability due to the lower probability of creating defects. Manufacturing costs are further decreased. An additional advantage over the prior art is that by forming a substantially planar upper surface between the field oxide region and the polysilicon layer such that the polysilicon layer does not cross over the upper surface of the field oxide region, the topography is not adversely effected. Planarization of these two layers will further reduce reflective notching problems and maintain the thickness of photoresists over the wafer which will allow for resolution of smaller image sizes with more accuracy.

What is claimed is:

1. A structure consisting of a portion of a semiconductor integrated circuit formed at a surface of a body, comprising:

a plurality of active regions at the surface;

an isolation structure formed above the surface and into a recess of the surface between a pair of the plurality of active regions;

an undoped oxide layer disposed over at least a portion of the surface of each active regions within the pair of active regions;

a doped first polysilicon layer disposed over the oxide layer wherein the first polysilicon layer over the oxide layer in one active region forms a gate electrode and the first polysilicon layer over the oxide layer forms an interconnect in the other active region within the pair of active regions; and wherein an upper surface of the first polysilicon layer is substantially planar with a central portion of the upper surface of the isolation structure; and a nitride spot at an interface between the isolation structure and the surface of the body.

2. A structure consisting of a portion of a semiconductor integrated circuit formed at a surface of a body, comprising:

a plurality of active regions at the surface;

an isolation structure formed above the surface and into a recess of the surface between a pair of the plurality of active regions;

an undoped oxide layer disposed over at least a portion of the surface of each active regions within the pair of active regions; and a doped first polysilicon layer disposed over the oxide layer wherein the first polysilicon layer over the oxide layer in one active region forms a gate electrode and the first polysilicon layer over the oxide layer forms an interconnect in the other active region within the pair of active regions; and wherein an upper surface of the first polysilicon layer is substantially planar with a central portion of the upper surface of the isolation structure, wherein the oxide layer is a composite layer comprising a thin nitride layer over the oxide layer.

3. The structure of claim 2, wherein the composite layer further comprises a seal oxide layer disposed over the thin nitride layer.

4. A structure consisting of a portion of a semiconductor integrated circuit formed at a surface of a body, comprising:

a gate oxide layer overlying a portion of an active region;

a polysilicon layer overlying the gate oxide layer wherein the gate oxide layer and the polysilicon layer comprise a gate electrode;

a field oxide region adjacent the active region wherein an upper surface of a central portion of the field oxide region is substantially planar with an upper surface of the gate electrode; and a nitride spot at an interface between the field oxide region and the active region.

5. A structure consisting of a portion of a semiconductor integrated circuit formed at a surface of a body, comprising:

a gate oxide layer overlying a portion of an active region;

a polysilicon layer overlying the gate oxide layer wherein the gate oxide layer and the polysilicon layer comprise a gate electrode; and a field oxide region adjacent the active region wherein an upper surface of a central portion of the field oxide region is substantially planar with an upper surface of the gate electrode, wherein the gate oxide layer is a composite layer comprising a thin nitride layer over the oxide layer.

6. The structure of claim 5, wherein the nitride layer has a thickness of between approximately 10 to 200 angstroms.

7. The structure of claim 5, wherein the gate oxide layer is a composite layer comprising a seal oxide layer over the thin nitride layer.

8. The structure of claim 7, wherein the seal oxide layer has thickness of between approximately 10 to 30 angstroms.

* * * * *